US008995484B2

(12) United States Patent
Ho et al.

(10) Patent No.: US 8,995,484 B2
(45) Date of Patent: Mar. 31, 2015

(54) TEMPERATURE CONTROLLED MULTI-CHANNEL TRANSMITTER OPTICAL SUBASSEMBLY AND OPTICAL TRANSCEIVER MODULE INCLUDING SAME

(71) Applicant: Applied Optoelectronics, Inc., Sugar Land, TX (US)

(72) Inventors: I-Lung Ho, Sugar Land, TX (US); Chong Wang, Stafford, TX (US); Justin Lii, Houston, TX (US)

(73) Assignee: Applied Optoelectronics, Inc., Sugar Land, TX (US)

( * ) Notice: Subject to any disclaimer, the term of this patent is extended or adjusted under 35 U.S.C. 154(b) by 59 days.

(21) Appl. No.: 13/774,125

(22) Filed: Feb. 22, 2013

(65) Prior Publication Data

US 2014/0241726 A1 Aug. 28, 2014

(51) Int. Cl.
*H01S 3/04* (2006.01)
*H04B 10/40* (2013.01)

(52) U.S. Cl.
CPC . *H01S 3/04* (2013.01); *H04B 10/40* (2013.01)
USPC .......................................................... 372/34

(58) Field of Classification Search
CPC ... H01S 5/005; H01S 5/0224; H01S 5/02248; H01S 5/02268; H01S 5/02272; H01S 5/183; H01S 5/22; H01S 5/176; H01S 5/024; H01S 5/022; H01S 3/04; H04B 10/40
USPC .................... 372/44.01, 36, 34, 35
See application file for complete search history.

(56) References Cited

U.S. PATENT DOCUMENTS 4,786,132 A 11/1988 Gordon
5,042,898 A 8/1991 Morey et al.
(Continued)

FOREIGN PATENT DOCUMENTS

JP 2000174397 A 6/2000
KR 20000049869 A 8/2000
(Continued)

OTHER PUBLICATIONS

Palmer, Christopher, "Diffraction Gratings—The Crucial Dispersive Component", The Baseline, reprinted from Spectroscopy, vol. 10, No. 2, Feb. 1995, pp. 14-15.
(Continued)

*Primary Examiner* — Tuan Nguyen
(74) *Attorney, Agent, or Firm* — Grossman Tucker Perreault & Pfleger, PLLC; Norman S. Kinsella

(57) ABSTRACT

A temperature controlled multi-channel transmitter optical subassembly (TOSA) may be used in a multi-channel optical transceiver. The temperature controlled multi-channel TOSA generally includes an array of lasers optically coupled to an optical multiplexer, such as an arrayed waveguide grating (AWG), to combine multiple optical signals at different channel wavelengths. The lasers may be thermally tuned to the channel wavelengths by establishing a global temperature for the array of lasers and separately raising local temperatures of individual lasers in response to monitored wavelengths associated with the lasers. A temperature control device, such as a TEC cooler coupled to the laser array, may provide the global temperature and individual heaters, such as resistors adjacent respective lasers, may provide the local temperatures. The optical transceiver may be used in a wavelength division multiplexed (WDM) optical system, for example, in an optical line terminal (OLT) in a WDM passive optical network (PON).

20 Claims, 5 Drawing Sheets

(56) References Cited

U.S. PATENT DOCUMENTS

| | | | |
|---|---|---|---|
| 5,499,256 | A | 3/1996 | Bischel et al. |
| 5,732,102 | A | 3/1998 | Bouadma |
| 5,757,828 | A | 5/1998 | Ouchi |
| 5,937,120 | A | 8/1999 | Higashi |
| 5,987,200 | A | 11/1999 | Fleming et al. |
| 6,111,999 | A | 8/2000 | Espindola et al. |
| 6,118,562 | A | 9/2000 | Lee et al. |
| 6,188,705 | B1 | 2/2001 | Krainak et al. |
| 6,192,170 | B1 * | 2/2001 | Komatsu ............... 385/15 |
| 6,275,629 | B1 | 8/2001 | Eggleton et al. |
| 6,303,040 | B1 | 10/2001 | Oh et al. |
| 6,411,746 | B1 | 6/2002 | Chamberlain et al. |
| 6,480,513 | B1 | 11/2002 | Kapany et al. |
| 6,683,895 | B2 | 1/2004 | Pilgrim et al. |
| 6,741,629 | B1 | 5/2004 | Garnache et al. |
| 6,853,671 | B2 | 2/2005 | Liu et al. |
| 6,917,636 | B2 | 7/2005 | Blauvelt et al. |
| 6,920,159 | B2 | 7/2005 | Sidorin et al. |
| 7,027,469 | B2 | 4/2006 | Sidorin et al. |
| 7,899,105 | B1 | 3/2011 | Hargis et al. |
| 7,965,949 | B1 | 6/2011 | Wach |
| 2001/0017960 | A1 | 8/2001 | Terahara |
| 2004/0114646 | A1 | 6/2004 | Stewart et al. |
| 2006/0171649 | A1 | 8/2006 | Hsieh et al. |
| 2006/0215713 | A1 | 9/2006 | Flanders et al. |
| 2006/0262818 | A1 * | 11/2006 | Kumar et al. ............ 372/34 |
| 2007/0133647 | A1 | 6/2007 | Daiber |
| 2007/0223552 | A1 | 9/2007 | Muendel et al. |
| 2008/0031294 | A1 | 2/2008 | Krishnamoorthy et al. |
| 2008/0080864 | A1 | 4/2008 | Bai |
| 2008/0259972 | A1 | 10/2008 | Heanue et al. |
| 2008/0267246 | A1 | 10/2008 | Volodin et al. |
| 2009/0185586 | A1 | 7/2009 | Jhung et al. |
| 2010/0158057 | A1 | 6/2010 | Lerner |
| 2010/0208756 | A1 | 8/2010 | Noh |
| 2010/0232458 | A1 | 9/2010 | Kim et al. |
| 2010/0266283 | A1 | 10/2010 | Beckett |
| 2011/0135309 | A1 | 6/2011 | Lee et al. |
| 2014/0161457 | A1 * | 6/2014 | Ho et al. ............... 398/79 |

FOREIGN PATENT DOCUMENTS

| | | |
|---|---|---|
| KR | 20000051030 A | 8/2000 |
| WO | 03012936 A2 | 2/2003 |

OTHER PUBLICATIONS

PCT International Search Report and Written Opinion dated Oct. 5, 2012 received in related PCT Application No. PCT/US2012/046902, 9 pgs.

PCT International Search Report and Written Opinion dated Oct. 22, 2012 received in corresponding PCT Application No. PCT/US2012/046912, 8 pgs.

Lee, San-Liang et al, "Trend and Applications of Tunable Semiconductor Lasers", Optoelectronic Materials and Devices II, Proc. of SPIE vol. 6782, 67821H, 2007, Taipei, Taiwan R.O.C., 10 pgs.

PCT International Search Report and Written Opinion mailed Jun. 6, 2014 received in corresponding PCT Application No. PCT/US2014/017583, 10 pgs.

* cited by examiner

TEMPERATURE CONTROLLED MULTI-CHANNEL TRANSMITTER OPTICAL SUBASSEMBLY AND OPTICAL TRANSCEIVER MODULE INCLUDING SAME

TECHNICAL FIELD

The present disclosure relates to multi-channel optical transmitters or transceivers and more particularly, to a temperature controlled multi-channel transmitter optical subassembly (TOSA).

BACKGROUND INFORMATION

Optical communications networks, at one time, were generally "point to point" type networks including a transmitter and a receiver connected by an optical fiber. Such networks are relatively easy to construct but deploy many fibers to connect multiple users. As the number of subscribers connected to the network increases and the fiber count increases rapidly, deploying and managing many fibers becomes complex and expensive.

A passive optical network (PON) addresses this problem by using a single "trunk" fiber from a transmitting end of the network, such as an optical line terminal (OLT), to a remote branching point, which may be up to 20 km or more. One challenge in developing such a PON is utilizing the capacity in the trunk fiber efficiently in order to transmit the maximum possible amount of information on the trunk fiber. Fiber optic communications networks may increase the amount of information carried on a single optical fiber by multiplexing different optical signals on different wavelengths using wavelength division multiplexing (WDM). In a WDM-PON, for example, the single trunk fiber carries optical signals at multiple channel wavelengths to and from the optical branching point and the branching point provides a simple routing function by directing signals of different wavelengths to and from individual subscribers. In this case, each subscriber may be assigned one or more of the channel wavelengths on which to send and/or receive data.

To transmit and receive optical signals over multiple channel wavelengths, the OLT in a WDM-PON may include a multi-channel transmitter optical subassembly (TOSA) and a multi-channel receiver optical subassembly (ROSA). One example of a TOSA includes an array of lasers optically coupled to an arrayed waveguide grating (AWG) to combine multiple optical signals at multiple channel wavelengths. To provide the different channel wavelengths, tunable lasers may be used in the multi-channel TOSA and the wavelengths emitted by the tunable lasers change with changes in temperature. The desired accuracy or precision of the wavelengths in a WDM-PON often depends on the number and spacing of the channel wavelengths and may be controlled in the TOSA by controlling temperature. In a 100 G dense WDM (DWDM) system, for example, the temperature may need to be controlled within ±0.5° C. to maintain a wavelength precision of ±0.5 nm and the temperature range may need to be greater than 4° C. to provide the desired wavelength yield of the laser diodes.

One challenge with such OLT transceiver modules is providing adequate temperature control of the laser array in a relatively small space and with relatively low power consumption. One way to control temperature of the individual laser diodes in a laser array is to use individual temperature control devices, such as thermoelectric (TEC) coolers, and temperature monitors (e.g., thermistors) for each of the respective laser diodes to provide a closed loop temperature control for each of the lasers based on a monitored temperature. To support 16 channels in a TOSA, for example, would require 16 TEC's, 16 thermistors, 32 ports for the thermistors and circuitry for controlling each of these components. Such a closed loop system requires a more complicated circuit design and higher cost and may not fit within a smaller form factor for the OLT transceiver module.

BRIEF DESCRIPTION OF THE DRAWINGS

These and other features and advantages will be better understood by reading the following detailed description, taken together with the drawings wherein.

DETAILED DESCRIPTION

A temperature controlled multi-channel transmitter optical subassembly (TOSA), consistent with embodiments described herein, may be used in a multi-channel optical transceiver. The temperature controlled multi-channel TOSA generally includes an array of lasers optically coupled to an optical multiplexer, such as an arrayed waveguide grating (AWG), to combine multiple optical signals at different channel wavelengths. The lasers may be thermally tuned to the channel wavelengths by establishing a global temperature for the array of lasers and separately raising local temperatures of individual lasers in response to monitored wavelengths associated with the lasers. A temperature control device, such as a TEC cooler coupled to the laser array, may provide the global temperature, and individual heaters, such as resistors adjacent respective lasers, may provide the local temperatures. The optical transceiver may be used in a wavelength division multiplexed (WDM) optical system, for example, in an optical line terminal (OLT) in a WDM passive optical network (PON).

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. As used herein, "tuning to a channel wavelength" refers to adjusting a laser output such that the emitted laser light includes the channel wavelength. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals. As used herein, "thermally coupled" refers to a direct or indirect connection or contact between two components resulting in heat being conducted from one component to the other component. As used herein, "thermally isolated" refers to an arrangement where heat is prevented from being conducted to the isolated component from an external environment. In a thermally isolated multi-channel TOSA, for example, heat external to the TOSA is prevented from being conducted to one or more components in the TOSA. As used herein, "thermally shielded" refers to an arrangement that prevents heat from being transferred by convection or radiation to the shielded component. Thermally isolated and thermally shielded do not necessarily require an arrangement to prevent all heat from being conducted or transferred.

Figure 1:
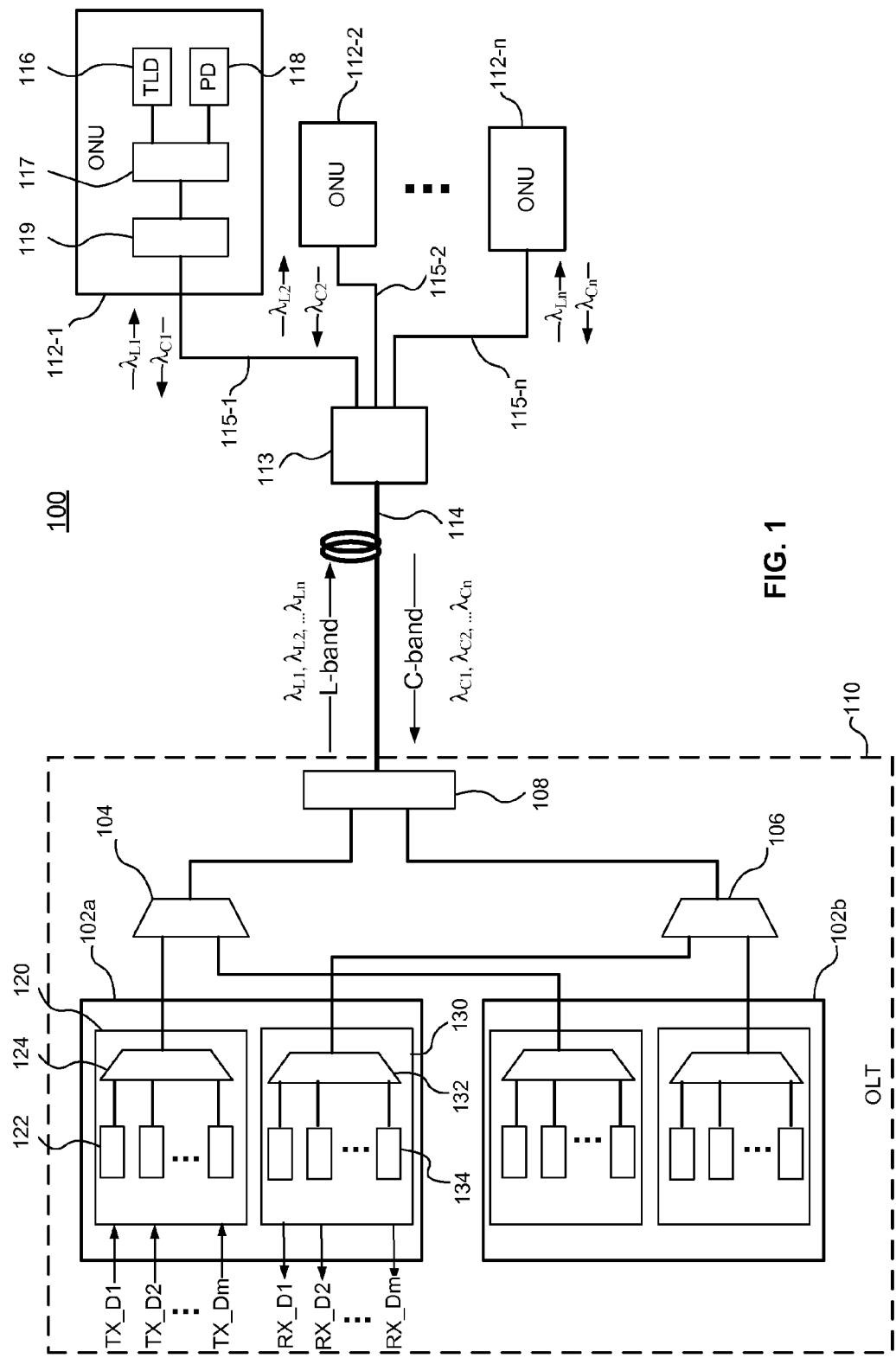
FIG. 1 is a functional block diagram of a wavelength division multiplexed (WDM) passive optical network (PON) including at least one multi-channel optical transceiver, consistent with embodiments of the present disclosure.

Referring to FIG. 1, a WDM-PON 100 including one or more multi-channel optical transceivers 102a, 102b, consistent with embodiments of the present disclosure, is shown and described. The WDM-PON 100 provides a point-to-multipoint optical network architecture using a WDM system. According to one embodiment of the WDM-PON 100, at least one optical line terminal (OLT) 110 may be coupled to a plurality of optical networking terminals (ONTs) or optical networking units (ONUs) 112-1 to 112-n via optical fibers, waveguides, and/or paths 114, 115-1 to 115-n. Although the OLT 110 includes two multi-channel optical transceivers 102a, 102b in the illustrated embodiment, the OLT 110 may include one or more multi-channel optical transceivers.

The OLT 110 may be located at a central office of the WDM-PON 100, and the ONUs 112-1 to 112-n may be located in homes, businesses or other types of subscriber location or premises. A branching point 113 (e.g., a remote node) couples a trunk optical path 114 to the separate optical paths 115-1 to 115-n to the ONUs 112-1 to 112-n at the respective subscriber locations. The branching point 113 may include one or more passive coupling devices such as a splitter or optical multiplexer/demultiplexer. In one example, the ONUs 112-1 to 112-n may be located about 20 km or less from the OLT 110.

The WDM-PON 100 may also include additional nodes or network devices, such as Ethernet PON (EPON) or Gigabit PON (GPON) nodes or devices, coupled between the branching point 113 and ONUs 112-1 to 112-n at different locations or premises. One application of the WDM-PON 100 is to provide fiber-to-the-home (FTTH) or fiber-to-the-premises (FTTP) capable of delivering voice, data, and/or video services across a common platform. In this application, the central office may be coupled to one or more sources or networks providing the voice, data and/or video.

In the WDM-PON 100, different ONUs 112-1 to 112-n may be assigned different channel wavelengths for transmitting and receiving optical signals. In one embodiment, the WDM-PON 100 may use different wavelength bands for transmission of downstream and upstream optical signals relative to the OLT 110 to avoid interference between the received signal and back reflected transmission signal on the same fiber. For example, the L-band (e.g., about 1565 to 1625 nm) may be used for downstream transmissions from the OLT 110 and the C-band (e.g., about 1530 to 1565 nm) may be used for upstream transmissions to the OLT 110. The upstream and/or downstream channel wavelengths may generally correspond to the ITU grid. In one example, the upstream wavelengths may be aligned with the 100 GHz ITU grid and the downstream wavelengths may be slightly offset from the 100 GHz ITU grid.

The ONUs 112-1 to 112-n may thus be assigned different channel wavelengths within the L-band and within the C-band. Transceivers or receivers located within the ONUs 112-1 to 112-n may be configured to receive an optical signal on at least one channel wavelength in the L-band (e.g., $\lambda_{L1}$, $\lambda_{L2}$, ... $\lambda_{Ln}$). Transceivers or transmitters located within the ONUs 112-1 to 112-n may be configured to transmit an optical signal on at least one channel wavelength in the C-band (e.g., $\lambda_{C1}$, $\lambda_{C2}$, ... $\lambda_{Cn}$). Other wavelengths and wavelength bands are also within the scope of the system and method described herein.

The branching point 113 may demultiplex a downstream WDM optical signal (e.g., $\lambda_{L1}$, $\lambda_{L2}$, ... $\lambda_{Ln}$) from the OLT 110 for transmission of the separate channel wavelengths to the respective ONUs 112-1 to 112-n. Alternatively, the branching point 113 may provide the downstream WDM optical signal to each of the ONUs 112-1 to 112-n and each of the ONUs 112-1 to 112-n separates and processes the assigned optical channel wavelength. The individual optical signals may be encrypted to prevent eavesdropping on optical channels not assigned to a particular ONU. The branching point 113 also combines or multiplexes the upstream optical signals from the respective ONUs 112-1 to 112-n for transmission as an upstream WDM optical signal (e.g., $\lambda_{C1}$, $\lambda_{C2}$, ... $\lambda_{Cn}$) over the trunk optical path 114 to the OLT 110.

One embodiment of the ONU 112-1 includes a laser 116, such as a laser diode, for transmitting an optical signal at the assigned upstream channel wavelength ($\lambda_{C1}$) and a photodetector 118, such as a photodiode, for receiving an optical signal at the assigned downstream channel wavelength ($\lambda_{L1}$). The laser 116 may include a tunable laser configured to be tuned to the assigned channel wavelength. This embodiment of the ONU 112-1 may also include a diplexer 117 coupled to the laser 116 and the photodetector 118 and a C+L band filter 119 coupled to the diplexer 117, which allow the L-band channel wavelength ($\lambda_{L1}$) to be received by the ONU 112-1 and the C-band channel wavelength ($\lambda_{C1}$) to be transmitted by the ONU 112-1.

The OLT 110 may be configured to generate multiple optical signals at different channel wavelengths (e.g., $\lambda_{L1}$, $\lambda_{L2}$, ... $\lambda_{Ln}$) and to combine the optical signals into the downstream WDM optical signal carried on the trunk optical fiber or path 114. Each of the OLT multi-channel optical transceivers 102a, 102b may include a multi-channel transmitter optical subassembly (TOSA) 120 for generating and combining the optical signals at the multiple channel wavelengths. The OLT 110 may also be configured to separate optical signals at different channel wavelengths (e.g., $\lambda_{C1}$, $\lambda_{C2}$, ... $\lambda_{Cn}$) from an upstream WDM optical signal carried on the trunk path 114 and to receive the separated optical signals. Each of the OLT multi-channel optical transceivers 102a, 102b may thus include a multi-channel receiver optical subassembly (ROSA) 130 for separating and receiving the optical signals at multiple channel wavelengths.

One embodiment of the multi-channel TOSA 120 includes an array of lasers 122, such as laser diodes, which may be modulated by respective RF data signals (TX_D1 to TX_Dm) to generate the respective optical signals. The lasers 122 may be modulated using various modulation techniques including external modulation and direct modulation. An optical multiplexer 124, such as an arrayed waveguide grating (AWG), combines the optical signals at the different respective downstream channel wavelengths (e.g., $\lambda_{L1}$, $\lambda_{L2}$, ... $\lambda_{Lm}$). The TOSA 120 may also include a temperature control system for controlling temperature of the lasers 122 and the multiplexer 124 to maintain a desired wavelength precision or accuracy. As described in greater detail below, the lasers 122 may be tuned to the channel wavelengths by raising the local temperature of the individual lasers 122 above a global temperature in response to monitored wavelengths. The lasers may also be thermally isolated and/or thermally shielded to facilitate temperature control, as described in greater detail below.

In some embodiments, the lasers 122 may be tunable lasers that generate the optical signals at the respective channel wavelengths. In other embodiments, the lasers 122 may generate optical signals over a band of channel wavelengths and filtering and/or multiplexing techniques may be used to produce the assigned channel wavelengths. Examples of optical transmitters including a laser array and AWG are disclosed in greater detail in U.S. patent application Ser. No. 13/543,310 (U.S. Patent Application Pub. No. 2013-0016971), U.S. patent application Ser. No. 13/357,130 (U.S. Patent Application Pub. No. 2013-0016977), and U.S. patent application Ser. No. 13/595,505 (U.S. Patent Application Pub. No. 20130223844), all of which are fully incorporated herein by reference. In the illustrated embodiment, the OLT 110 further includes a multiplexer 104 for multiplexing the multiplexed optical signal from the multi-channel TOSA 120 in the multi-channel transceiver 102a with a multiplexed optical signal from a multi-channel TOSA in the other multi-channel transceiver 102b to produce the downstream aggregate WDM optical signal.

One embodiment of the multi-channel ROSA 130 includes a demultiplexer 132 for separating the respective upstream channel wavelengths (e.g., $\lambda_{C1}$, $\lambda_{C2}$, . . . $\lambda_{Cn}$). An array of photodetectors 134, such as photodiodes, detects the optical signals at the respective separated upstream channel wavelengths and provides the received data signals (RX_D1 to RX_Dm). In the illustrated embodiment, the OLT 110 further includes a demultiplexer 106 for demultiplexing the upstream WDM optical signal into first and second WDM optical signals provided to the respective multi-channel ROSA in each of the transceivers 102a, 102b. The OLT 110 also includes a diplexer 108 between the trunk path 114 and the multiplexer 104 and the demultiplexer 106 such that the trunk path 114 carries both the upstream and the downstream channel wavelengths. The transceivers 102a, 102b may also include other components, such as laser drivers, transimpedance amplifiers (TIAs), and control interfaces, used for transmitting and receiving optical signals.

In one example, each of the multi-channel optical transceivers 102a, 102b may be configured to transmit and receive 16 channels such that the WDM-PON 100 supports 32 downstream L-band channel wavelengths and 32 upstream C-band channel wavelengths. In one example, the downstream L-band link between the OLT transceivers 102a, 102b and the ONUs 112-1 to 112-n may support a power budget of at least about 26 dB and the upstream C-band link between the ONUs 112-1 to 112-n and the OLT transceivers 102a, 102b may support a power budget of at least about 23 dB. One example of the WDM-PON 100 may operate at 1.25 Gbaud using 8B/10B encoded on-off keying as the modulation scheme. Other data rates and modulation schemes may also be used.

As mentioned above, the upstream and downstream channel wavelengths may span a range of channel wavelengths on the 100 GHz ITU grid. Each of the transceivers 102a, 102b, for example, may cover 16 channel wavelengths in the L-band for the TOSA and 16 channel wavelengths in the C-band for the ROSA such that the transceivers 102a, 102b together cover 32 channels. Thus, the multiplexer 104 may combine 16 channels from one transceiver 102a with 16 channels from the other transceiver 102b, and the demultiplexer 106 may separate a 32 channel WDM optical signal into two 16 channel WDM optical signals. To facilitate use of the multiplexer 104 and the demultiplexer 106, the range of channel wavelengths may skip channels (e.g., 2 channels) in the middle of the range. According to one example of a multi-channel optical transceiver used in the WDM-PON 100, the desired wavelength precision or accuracy is ±0.05 nm, the desired operating temperature is between −5 and 70° C., and the desired power dissipation is about 16.0 W.

Figure 2:
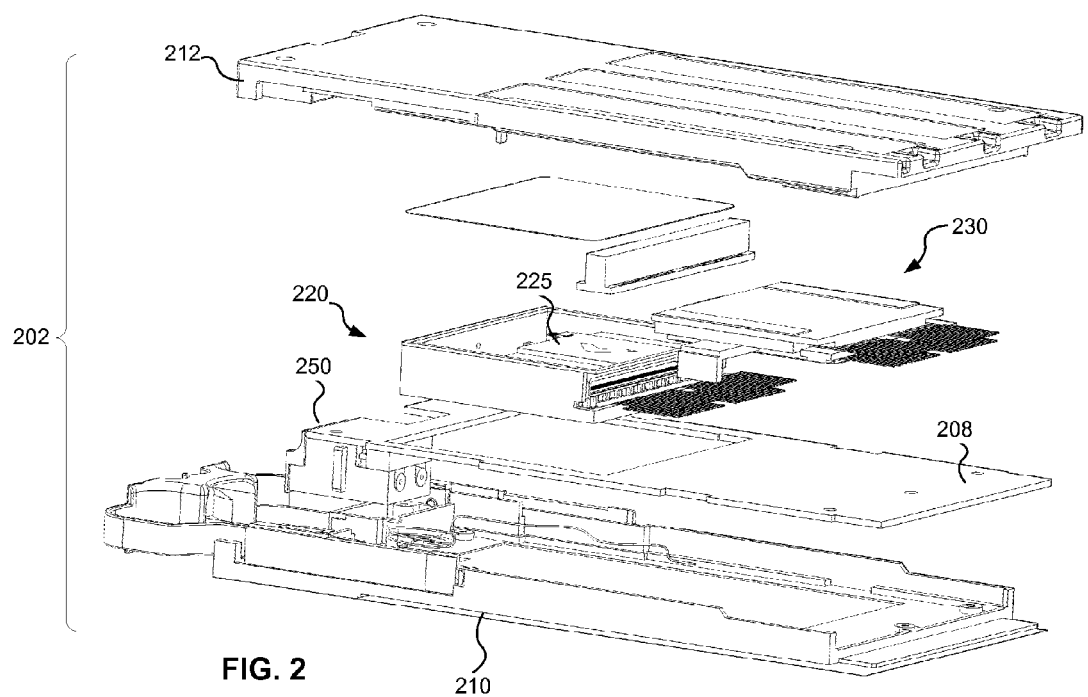
FIG. 2 is an exploded view of a multi-channel optical transceiver including a temperature controlled multi-channel TOSA, consistent with an embodiment of the present disclosure.
Figure 3:
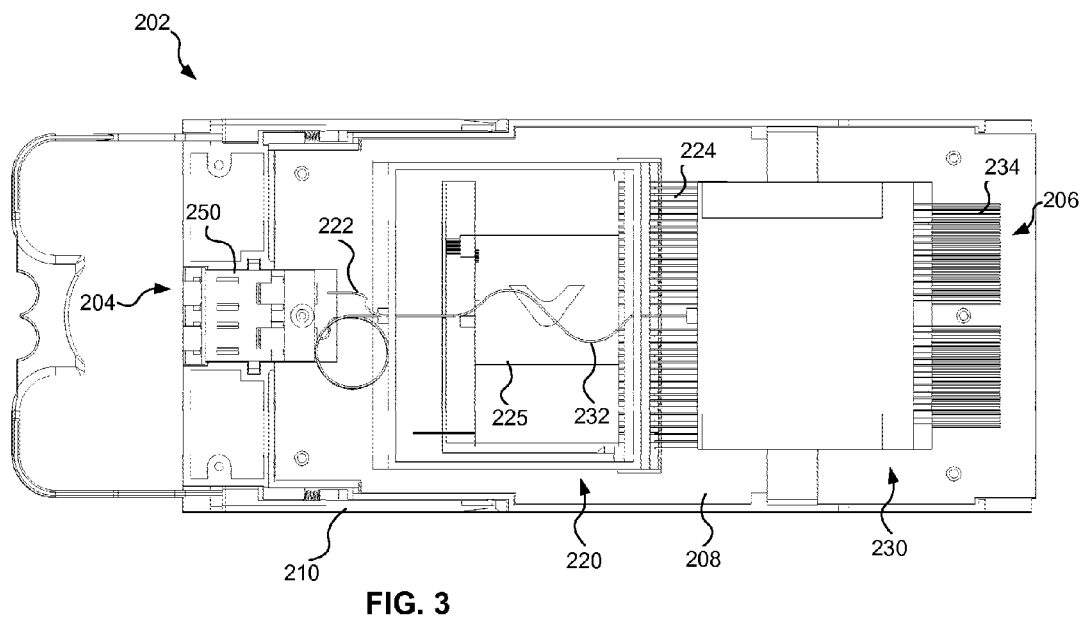
FIG. 3 is a top view inside the multi-channel optical transceiver shown in FIG. 2.

Referring to FIGS. 2 and 3, one embodiment of a multi-channel optical transceiver module 202 including a temperature controlled multi-channel TOSA 220 is shown and described in greater detail. As discussed above, multiple multi-channel transceiver modules may be used in an OLT of a WDM-PON to cover a desired channel range. The transceiver module 202 and the multi-channel TOSA 220 within the transceiver module 202 may thus be designed to have a relatively small form factor with minimal space. The multi-channel optical transceiver module 202 generally provides an optical input and output at one end 204 and electrical input and output at another end 206. The transceiver module 202 includes a transceiver housing 210 containing the thermally isolated multi-channel TOSA 220, a multi-channel ROSA 230, and a dual fiber type direct link adapter 250 directly linked to the TOSA 220 and the ROSA 230 for providing the optical input and output.

The dual fiber type direct link adapter 250 is coupled to the TOSA 220 and to the ROSA 230 with respective optical fibers 222, 232 to provide the direct link between the adapter 250 and both the TOSA 220 and the ROSA 230. The dual fiber type direct link adapter 250 is also configured to receive pluggable optical connectors, such as LC connectors (not shown), to connect the TOSA 220 and ROSA 230, respectively, to fiber optic cables (not shown). When the pluggable optical connectors are plugged into the dual fiber type direct link adapter 250, the adapter 250 establishes an optical coupling between the TOSA 220 and the ROSA 230 and the respective optical fibers in the fiber-optic cables, which carry the optical signals to and from the transceiver.

The temperature controlled multi-channel TOSA 220 includes an array of lasers (not shown in FIGS. 2 and 3) coupled to an AWG 225. A temperature control system, as will be described in greater detail below, controls the temperature of the individual lasers to provide a desired wavelength with a desired wavelength precision or accuracy. In one example, the temperature of each laser is maintained within ±0.5° C. in the operating range between −5 and 70° C. to maintain a wavelength precision or accuracy of about ±0.05 nm. The temperature control system may control the temperature by raising the local temperatures of individual lasers individually above a global temperature and adjusting the local temperatures in response to monitored wavelengths associated with the lasers. The temperature control system may also be used to control the temperature of the AWG 225 using the same temperature control device.

The transceiver module 202 may also include one or more printed circuit boards 208 coupled to the TOSA 220 and/or ROSA 230. The printed circuit board(s) 208 may include circuitry and electronic components such as laser drivers, transimpedance amplifiers (TIAs), control interfaces, and temperature control circuitry. The TOSA 220 is coupled to conductive leads 224 for carrying the electronic signals including the data to be transmitted by the TOSA 220. The ROSA 230 is coupled to the conductive leads 234 for carrying the electronic signals including the data received by the ROSA 230.

A top housing portion 212 encloses the TOSA 220, the ROSA 230, the adapter 250, the optical fibers 222, 232, and other components within the housing 210. The transceiver housing 210 may have a width of less than about 55 mm, a length of less than about 130 mm, and a height of less than about 10 mm. More specifically, one example of a transceiver housing 210 may have a width of 54.6 mm, a length of 110 mm, and a height of about 9.8 mm. Within the transceiver module 202, the thermally isolated multi-channel TOSA 220 has a width, a height and length capable of fitting within the transceiver housing 210.

Figure 4:
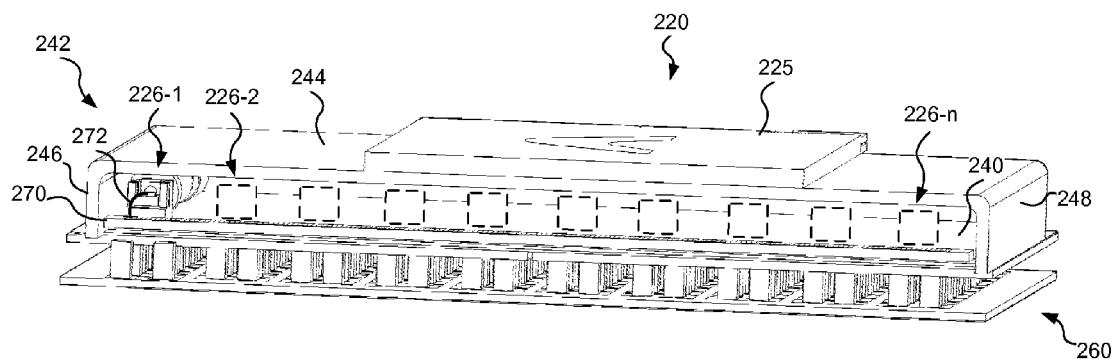
FIG. 4 is an end perspective view of one embodiment of a temperature controlled multi-channel TOSA.
Figure 5:
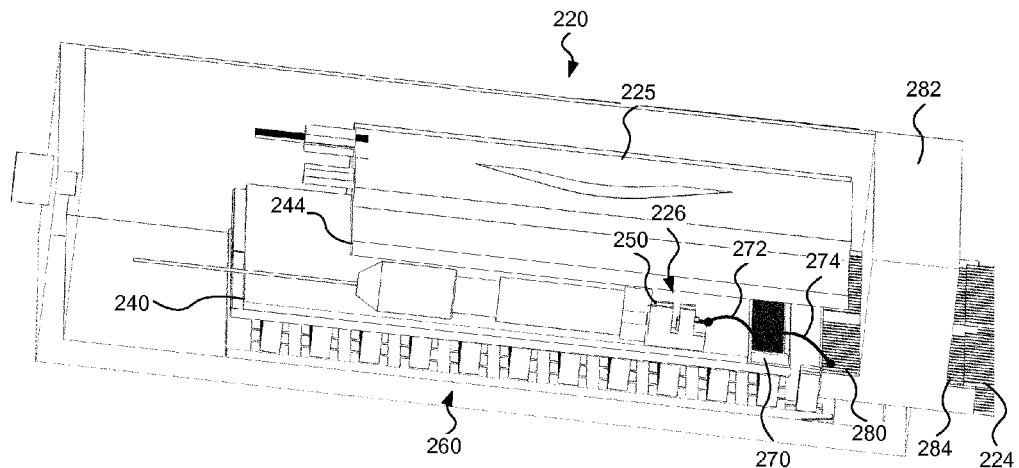
FIG. 5 is a side perspective view of the temperature controlled multi-channel TOSA shown in FIG. 4.

Referring to FIGS. 4 and 5, an embodiment of the temperature controlled multi-channel TOSA 220 is described in greater detail. This embodiment of the temperature controlled multi-channel TOSA 220 is also thermally isolated and thermally shielded to facilitate the temperature control. The temperature control system and method described herein may also be used in other embodiments of a multi-channel TOSA, for example, without thermal isolation and/or thermal shielding.

This embodiment of the temperature controlled multi-channel TOSA 220 includes an array of lasers 226-1 to 226-$n$ (only laser 226-1 is shown in detail) optically coupled to the AWG 225. Each of the lasers 226-1 to 226-$n$ in the array may be a distributed feedback (DFB) laser capable of altering lasing wavelengths in response to temperature changes and may be thermally shielded, as described in greater detail below. The lasers 226-1 to 226-$n$ may be optically coupled to the AWG 225, for example, using low bending loss optical fibers (not shown). Each laser 226-1 may be provided as a laser package including, but not limited to, a laser diode chip mounted on a laser mounting structure or sub-mount. The laser package may also include optical components, such as a lens for optically coupling the laser light into a respective one of the optical fibers, and/or optoelectronic components, such as a monitor photodiode. The AWG 225 may include an AWG chip such as the type used for WDM, Coarse WDM (CWDM), or Dense (DWDM) multiplexing or demultiplexing.

In this embodiment, the array of lasers 226-1 to 226-$n$ are supported on a laser array tray 240 and the AWG 225 is supported on an AWG tray 242. Both the laser array tray 240 and the AWG tray 242 may be thermally coupled to the same temperature control device 260 such that the temperature control device 260, the laser array tray 240 and the AWG tray 242 provide a temperature control system for the TOSA within a relatively small space. The temperature control device 260 may be a thermoelectric cooler, such as a Peltier device, for cooling the array of lasers 226-1 to 226-$n$ and the AWG 225. In this embodiment, the AWG tray 242 supports the AWG 225 above the lasers 226-1 to 226-$n$. By using the same temperature control device and supporting the AWG 225 above the lasers 226-1 to 226-$n$, a desired temperature range can be maintained with relatively low power consumption and within a relatively small space.

In the illustrated embodiment, the AWG tray 242 includes a supporting portion 244 that supports the AWG 225 and side portions 246, 248 that hold the supporting portion 244 above the lasers 226-1 to 226-$n$. The laser array tray 240 may be a relatively flat plate that fits between the side portions 246, 248 such that both the laser array tray 240 and the side portions 246, 248 of the AWG tray 242 are separately thermally coupled to the temperature control device 260 (e.g., to the cold side of a TEC). The laser array tray 240 and the side portions 246, 248 of the AWG tray 242 may each directly contact the temperature control device 260 or may be thermally coupled through another thermally conductive material. Because a larger surface area of the laser array tray 240 is thermally coupled to the temperature control device 260, the temperature of the lasers 226-1 to 226-$n$ may be controlled more precisely. Although the illustrated embodiment shows a particular shape for the trays 240, 242, other shapes and configurations may also be used to support the lasers 226-1 to 226-$n$ and the AWG 225 and to provide thermal coupling to the same temperature control device 260. Each of the trays 240, 242 may also be formed as one piece or multiple pieces. Other embodiments of a multi-channel TOSA may also use different structures to support the lasers and/or AWG.

Both of the trays 240, 242 may be made of a thermally conductive material having a thermal conductivity greater than 60 W/(m·K) and more specifically greater than 80 W/(m·K). The trays 240, 242 may be made, for example of copper or zinc. At least a portion of the trays 240, 242 may also be gold plated, for example, to facilitate soldering to the trays 240, 242. In one example, the laser array tray 240 is made of AlN with a thermal conductivity of about 170 W/(m·K) and the AWG tray 242 is made of copper with Au plating and having a thermal conductivity of greater than 300 W/(m·K).

To provide thermal isolation in this embodiment, the multi-channel TOSA 220 also includes a thermal isolation bar 270 for providing electrical connections between the lasers 226-1 to 226-$n$ (and/or other components) and external circuitry. The thermal isolation bar 270 is thermally coupled to the temperature control device 260 (e.g., to the cold side of a TEC) to prevent heat from being conducted to the lasers 226-1 to 226-$n$. In particular, the thermal isolation bar 270 may directly contact the temperature control device 260 or may contact the laser array tray 240. In the illustrated embodiment, the thermal isolation bar 270 extends across the array of lasers 226-1 to 226-$n$ from one side to the other side of the TOSA 220. In other embodiments, the thermal isolation bar 270 may include multiple sections and/or may extend across only a portion of the TOSA 220. Each of the lasers 226 (and/or other optoelectronic components) is wire bonded with at least one wire 272 to a conductive pad 271 on the thermal isolation bar 270. Although a single laser 226 is shown with a single wire 272, multiple wires 272 may be used to wire bond each of the lasers (e.g., lasers 226-1 to 226-$n$ shown in FIG. 4) to separate conductive pads on the thermal isolation bar 270. Although the thermal isolation bar 270 is shown having a rectangular shape, other shapes and configurations are possible.

The thermal isolation bar 270 provides an electrical connection between the lasers 226 and external circuitry, such as the printed circuit board 208. As shown, for example, the thermal isolation bar 270 is wire bonded with wires 274 to conductive pads 280 located on a TOSA housing portion 282. The conductive pads 280 are electrically connected to circuitry, for example, via conductive traces or paths 284 extending through the housing portion 282 and via the conductive leads 224 (see FIG. 5). Multiple wires 274 may be used between respective conductive pads 271 on the thermal isolation bar 270 and the conductive pads 280 on the housing portion 282 to provide multiple electrical connections between each of the lasers in a laser array and the circuitry. Although a specific arrangement providing an electrical connection to external circuitry is illustrated and described, other arrangements may also provide an electrical connection to the circuitry.

Because the thermal isolation bar 270 is thermally coupled to the temperature control device 260, the temperature of the thermal isolation bar 270 may be controlled (e.g., by cooling or heating) to prevent heat from being conducted from the pads 280, which are linked to the external environment, to the lasers 226. The thermal isolation bar 270 thus isolates the lasers 226 from the external heat generated in the environment external to the TOSA 220 while allowing the lasers 226 to be electrically connected to circuitry outside of the TOSA 220. The thermal isolation bar 270 may be made of a thermally conductive material having a thermal conductivity greater than 60 W/(m·K), such as, for example, aluminum nitride (AlN). The conductive traces or paths on the thermal isolation bar 270 may include gold, for example, to facilitate solderability.

Figure 6:
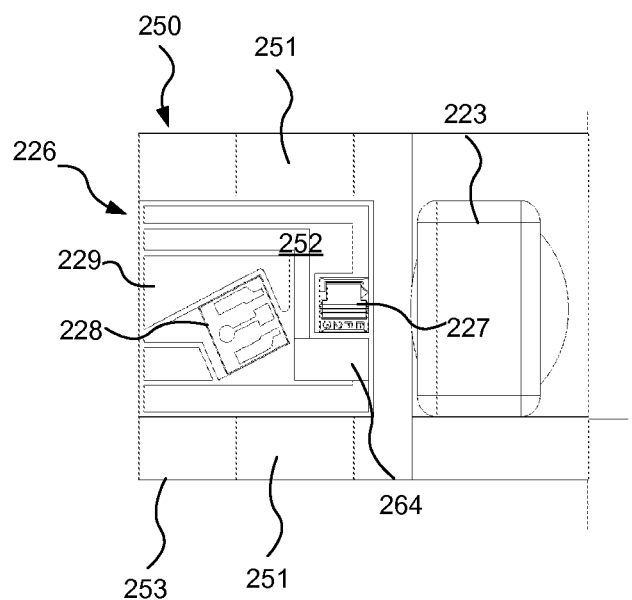
FIG. 6 is a top view of one embodiment of a thermally shielded laser package in a temperature controlled multi-channel TOSA.

As shown in greater detail in FIG. 6, each laser 226 may be thermally shielded by a laser thermal shield 250 defining a thermally shielded compartment 252. In this embodiment, the laser thermal shield 250 includes walls 251 extending from a base 253 to define the thermally shielded compartment 251. The laser thermal shield 250 is thermally coupled to the temperature control device 260, for example, via the laser tray 240. The temperature control device 260 may thus maintain a consistent temperature (e.g., 40° C.) of the laser thermal shield 250 such that the walls 251 of the thermal shield 250 thermally shield the laser 226 from heat within the TOSA (e.g., from other lasers and/or from thermal air flow in the TOSA). Although a single thermal shield 250 is shown thermally shielding a single laser 226, a plurality of thermal shields may be used to thermally shield the respective lasers 226-1 to 226-n in the laser array.

The laser array thermal shield 250 may be made of a thermally conductive material having a thermal conductivity greater than 60 W/(m·K) and more specifically greater than 80 W/(m·K) and, for example, about 160 W/(m·K). The laser array thermal shield 440 may be made, for example, from copper tungsten and may also be gold plated, for example, to facilitate soldering. Other thermally conductive materials may also be used.

As shown, the laser 226 includes a laser diode chip 227 (e.g., a DFB laser diode chip) mounted on a sub-mount 229. The thermally shielded compartment 252 is configured to receive the sub-mount 229 between the walls 251. A monitor photodiode 228 may also be mounted on the sub-mount 229, for example, to monitor light emitted from the laser diode chip 227. A heater 264, such as a resistor, may be located adjacent the laser diode chip 227 to provide independent control of the temperature of the laser diode chip 227 and thus the wavelength of the emitted laser light. During operation, for example, the temperature control device 260 may be used to establish a consistent global temperature of the array of lasers 226-1 to 226-n and the heaters 264 may be used to raise the local temperature of each of the lasers 226 individually and independently above this global temperature to change the wavelength, as will be described in greater detail below. The thermal shield 250 facilitates this independent temperature control of each of the lasers by preventing heat from outside of the thermally shielded compartment 252 from affecting the laser diode chip 227. In other embodiments, other temperature control devices, such as a micro TEC, may be used to provide the individual and independent temperature control of the laser diode chip 227.

The illustrated embodiment of the laser thermal shield 250 is also configured to receive a lens 223, for example, to focus emitted laser light into an optical fiber or waveguide. As shown, the laser thermal shield 250 also receives and supports the lens such that the laser diode chip 227 is aligned with the lens 223. Although the illustrated embodiment shows the laser thermal shield 250 with a particular shape, other shapes and configurations are also possible. In other embodiments, for example, the laser thermal shield 250 may be closed at the top.

Figure 7A:
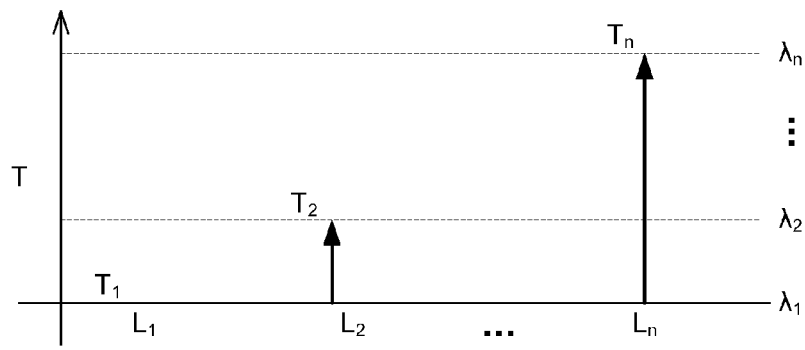
FIG. 7A is a chart illustrating the change in wavelength of each of the lasers in the temperature controlled multi-channel TOSA as a function of temperature.
Figure 7:
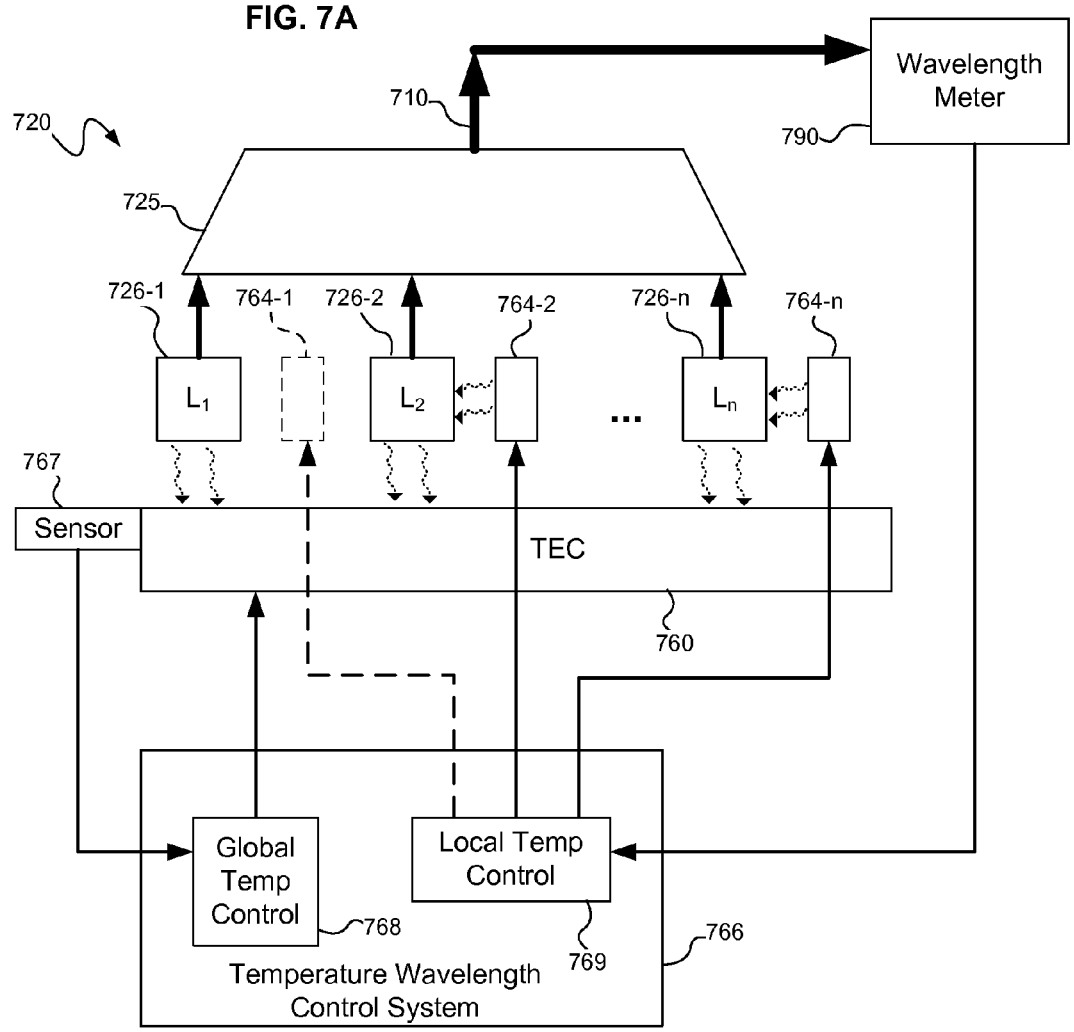
FIG. 7 is a diagrammatic view of a temperature controlled multi-channel TOSA, consistent with an embodiment of the present disclosure.

Referring to FIGS. 7 and 7A, a system and method of controlling temperature for tuning channel wavelengths in a temperature controlled multi-channel TOSA 720 is described in greater detail. The temperature controlled multi-channel TOSA 720 generally includes an array of lasers 726-1 to 726-n and an optical multiplexer 725 that combines the laser light emitted from the lasers 726-1 to 726-n at the channel wavelengths. The lasers 726-1 to 726-n may include thermally tunable DFB laser diodes with a wavelength drift of about 0.1 nm/° C. and the optical multiplexer 725 may include an AWG. In one embodiment, the TOSA 720 may include 16 lasers 726-1 to 726-n to provide 16 channels, although other embodiments may include other numbers of lasers.

A global temperature $T_1$ is established for the array of lasers 726-1 to 726-n such that at least one of the lasers (e.g., laser 726-1 or $L_1$) is tuned to one of the channel wavelengths (e.g., $\lambda_1$) at the global temperature $T_1$. The channel wavelength $\lambda_1$ that is tuned at the global temperature $T_1$ may be, for example, the closest ITU channel. At the global temperature $T_1$, the other lasers (e.g., laser 726-2 to 726-n or $L_2 \ldots L_n$) may emit wavelengths that are shorter than the other respective channel wavelengths. Thus, the local temperatures (e.g., $T_2 \ldots T_n$) of the other individual lasers (e.g., laser 726-2 to 726-n or $L_2 \ldots L_n$) may be raised above the global temperature $T_1$ to fine tune the other lasers to the other channel wavelengths (e.g., $\lambda_1 \ldots \lambda_n$). These local temperatures (e.g., $T_2 \ldots T_n$) may then be adjusted in response to monitored wavelengths associated with these other lasers (e.g., laser 726-2 to 726-n) such that the lasers remain tuned to the channel wavelengths (e.g., $\lambda_1 \ldots \lambda_n$).

As shown in FIG. 7, a temperature control device 760, such as a TEC, is thermally coupled to the array of lasers 726-1 to 726-n to establish the global temperature $T_1$. For example, the temperature control device 760 may cool the array of lasers 726-1 to 726-n to establish the global temperature $T_1$. Individual heaters 764-1 to 764-n, such as resistors, are located adjacent the respective lasers 726-1 to 726-n to raise the local temperatures of the lasers above the global temperature established by the temperature control device 760. Although the illustrated embodiment shows a heater 764-1 adjacent the laser 726-1, this heater 764-1 may not be needed if this laser 726-1 remains tuned at the channel wavelength $\lambda_1$ as a result of the global temperature $T_1$ established by the temperature control device 760.

The temperature controlled multi-channel TOSA 720 further includes a temperature wavelength control system 766 for controlling the temperature control device 760 and heaters 764-1 to 764-n. The temperature wavelength control system 766 may be implemented, for example, using any combination of hardware, software and firmware and may be located on a circuit board located in the TOSA (e.g., circuit board 208 shown in FIG. 2). The temperature wavelength control system 766 may include a global temperature control 768 for controlling the global temperature and a local temperature control 769 for controlling the local temperatures.

The global temperature control 768 controls the global temperature established by the temperature control device 760 in response to a monitored temperature obtained, for example, from a sensor 767 such as a thermistor. In particular, the global temperature control 768 may receive a global temperature signal indicative of a monitored global temperature from the sensor 767 and may compare the monitored global temperature with a target global temperature. The global temperature control 768 may then provide a control signal to the temperature control device 760 to raise or lower the monitored global in a feedback control loop. The sensor 767 may be located on the temperature control device 760 or in any other location capable of sensing the global temperature $T_1$ established for the array of lasers 726-1 to 726-n (e.g., on a baseplate coupled to the TEC or on the laser array tray 240 shown in FIG. 5). Other techniques for establishing the global temperature may also be used.

The local temperature control 769 controls the local temperature established by each of the heaters 764-1 to 764-n in response to monitored wavelengths obtained, for example, from a wavelength meter 790. The wavelength meter 790 may be located outside of the TOSA 720. A demultiplexer (not shown) may demultiplex the combined WDM optical signal 710 transmitted by the TOSA 720 and the wavelength meter 790 monitors the respective wavelengths of the demultiplexed channels associated with the respective lasers. The local temperature control 769 may then provide local temperature control signals to the respective heaters (e.g., 764-2 to 764-n), in response to the monitored wavelengths, to raise or lower the local temperatures such that the lasers (e.g., 726-2 to 726-n) remain tuned to the respective channel wavelengths.

Where the heaters 764-1 to 764-n are resistors, for example, the local temperature control signals may be the current supplied to the resistors, which may be adjusted to adjust the heat provided by the resistors and thus the local temperatures. In one embodiment, the local temperature control 769 receives monitored wavelength data representative of the monitored wavelengths and compares the monitored wavelengths to target channel wavelengths. In other embodiments, the comparison of the monitored wavelengths and the target channel wavelengths may occur outside of the TOSA 720 and the local temperature control 769 may receive a signal that indicates whether or not to raise or lower the local temperatures, respectively.

According to one example, the wavelengths may be initially tested by the wavelength meter 790 for all of the channels to determine which of the channels is closest to an ITU channel. The global temperature may then be determined such that the laser (e.g., laser 726-1) closest to the ITU channel is tuned to that channel at the global temperature $T_1$. The resistor currents may also be determined for each of the resistor heaters to provide the local temperatures $T_2 \ldots T_n$ that will tune the other lasers (e.g., lasers 726-2 to 726-n) to the other channel wavelengths. During operation of the TOSA according to this example, the TEC is then turned on and set to the determined global temperature, and the heater resistors are provided with the resistor currents determined to provide the local temperatures. The wavelength meter 790 then monitors the wavelengths, and the local temperature control 769 adjusts the resistor currents in response to the monitored wavelengths to maintain the lasers tuned to the respective channel wavelengths.

Accordingly, the temperature controlled multi-channel TOSA, consistent with embodiments described herein, allows the lasers in a laser array to be individually thermally tuned to the associated channel wavelengths in response to monitored wavelengths without requiring multiple temperature monitors and multiple TECs. The temperature control and wavelength tuning may thus be implemented with less complex circuitry and in a smaller space with lower power consumption.

Consistent with an embodiment, a method for controlling temperature for individually tuning lasers in a laser array to a plurality of channel wavelengths in a multi-channel transmitter optical subassembly (TOSA). The method includes: establishing a global temperature for the laser array such that at least one laser in the laser array is tuned to one of the channel wavelengths at the global temperature; raising local temperatures for other lasers in the laser array individually above the global temperature such that the other lasers are tuned to the other channel wavelengths, respectively; monitoring the wavelengths associated with each of the lasers; and adjusting the local temperatures of the other lasers in response to monitored wavelengths to maintain the other lasers tuned to the other channel wavelengths.

Consistent with another embodiment, a temperature controlled multi-channel transmitter optical subassembly (TOSA) includes a TOSA housing, an array of lasers located in the TOSA housing and configured to generate laser light and an optical multiplexer located in the TOSA housing and optically coupled to the array of lasers. Each of the lasers is associated with a respective optical channel and is thermally tunable to a channel wavelength associated with the respective optical channel, and the optical multiplexer is configured to combine the laser light at different respective channel wavelengths. The multi-channel TOSA also includes a temperature control device located in the TOSA housing and thermally coupled to the array of lasers for establishing a global temperature for the array of lasers such that at least one laser in the array of lasers is tuned to at least one of the channel wavelengths at the global temperature. The multi-channel TOSA further includes a plurality of heaters located proximate at least other respective lasers in the array of lasers, respectively. The heaters are configured to raise respective local temperatures of the other respective lasers above the global temperature such that the other respective lasers are tuned to the other channel wavelengths, respectively. A temperature wavelength control system controls the temperature control device to maintain the global temperature and controls the heaters to adjust the local temperatures in response to monitored wavelengths.

Consistent with a further embodiment, a multi-channel transceiver module includes a transceiver housing and at least one temperature controlled multi-channel transmitter optical subassembly (TOSA) located in the transceiver housing. The TOSA is configured to transmit a wavelength division multiplexed (WDM) optical signal on multiple channel wavelengths. The TOSA includes an array of lasers configured to generate laser light and an optical multiplexer optically coupled to the array of lasers. Each of the lasers is associated with a respective optical channel and is thermally tunable to a channel wavelength associated with the respective optical channel, and the optical multiplexer is configured to combine the laser light at different respective channel wavelengths. The multi-channel TOSA also includes a temperature control device thermally coupled to the array of lasers for establishing a global temperature for the array of lasers such that at least one laser in the array of lasers is tuned to at least one of the channel wavelengths at the global temperature. The multi-channel TOSA further includes a plurality of heaters located proximate at least other respective lasers in the array of lasers, respectively. The heaters are configured to raise respective local temperatures of the other respective lasers above the global temperature such that the other respective lasers are tuned to the other channel wavelengths, respectively. A temperature wavelength control system controls the temperature control device to maintain the global temperature and controls the heaters to adjust the local temperatures in response to monitored wavelengths. The multi-channel transceiver module further includes at least one multi-channel receiver optical subassembly (ROSA) located in the transceiver housing. The ROSA is configured to receive a wavelength division multiplexed (WDM) optical signal on multiple channel wavelengths.

Consistent with yet another embodiment, an optical line terminal includes at least first and second multi-channel transceivers. Each of the multi-channel transceivers include a transceiver housing and a temperature controlled multi-channel transmitter optical subassembly (TOSA) located in the transceiver housing. The TOSA is configured to transmit a wavelength division multiplexed (WDM) optical signal on multiple channel wavelengths. The TOSA includes an array of lasers configured to generate laser light and an optical multiplexer optically coupled to the array of lasers. Each of the lasers is associated with a respective optical channel and is thermally tunable to a channel wavelength associated with the respective optical channel, and the optical multiplexer is configured to combine the laser light at different respective channel wavelengths. The multi-channel TOSA also includes a temperature control device thermally coupled to the array of lasers for establishing a global temperature for the array of lasers such that at least one laser in the array of lasers is tuned to at least one of the channel wavelengths at the global temperature. The multi-channel TOSA further includes a plurality of heaters located proximate at least other respective lasers in the array of lasers, respectively. The heaters are configured to raise respective local temperatures of the other respective lasers above the global temperature such that the other respective lasers are tuned to the other channel wavelengths, respectively. A temperature wavelength control system controls the temperature control device to maintain the global temperature and controls the heaters to adjust the local temperatures in response to monitored wavelengths. The multi-channel transceiver module further includes at least one multi-channel receiver optical subassembly (ROSA) located in the transceiver housing. The ROSA is configured to receive a wavelength division multiplexed (WDM) optical signal on multiple channel wavelengths.

While the principles of the invention have been described herein, it is to be understood by those skilled in the art that this description is made only by way of example and not as a limitation as to the scope of the invention. Other embodiments are contemplated within the scope of the present invention in addition to the exemplary embodiments shown and described herein. Modifications and substitutions by one of ordinary skill in the art are considered to be within the scope of the present invention, which is not to be limited except by the following claims.

What is claimed is:

1. A method for controlling temperature for individually tuning lasers in a laser array to a plurality of channel wavelengths in a multi-channel transmitter optical subassembly (TOSA), the method comprising: establishing a global temperature for the laser array such that at least one laser in the laser array is tuned to one of the channel wavelengths at the global temperature; raising local temperatures for other lasers in the laser array individually above the global temperature such that the other lasers are tuned to the other channel wavelengths, respectively; monitoring the wavelengths associated with each of the lasers; and adjusting the local temperatures of the other lasers in response to monitored wavelengths to maintain the other lasers tuned to the other channel wavelengths; wherein the one of the channel wavelengths tuned at the global temperature is the smallest of the channel wavelengths.

2. The method of claim 1 wherein raising the local temperatures includes heating the lasers with heaters adjacent the lasers.

3. The method of claim 2 wherein the heaters include resistors, and wherein raising and adjusting the local temperatures include adjusting a current applied to the resistors.

4. The method of claim 1 wherein the channel wavelengths include ITU channels wavelengths.

5. The method of claim 1 wherein establishing the global temperature includes:
cooling the laser array with a temperature control device;
monitoring a temperature provided by the temperature control device; and
adjusting the temperature control device in response to the monitored temperature until the monitored temperature reaches the global temperature.

6. The method of claim 1, wherein the wavelengths are monitored outside of the TOSA.

7. A temperature controlled multi-channel transmitter optical subassembly (TOSA) comprising: a TOSA housing; an array of lasers located in the TOSA housing and configured to generate laser light, wherein each of the lasers is associated with a respective optical channel and is thermally tunable to a channel wavelength associated with the respective optical channel; an optical multiplexer located in the TOSA housing and optically coupled to the array of lasers, the optical multiplexer being configured to combine the laser light at different respective channel wavelengths; a temperature control device located in the TOSA housing and thermally coupled to the array of lasers for establishing a global temperature for the array of lasers such that at least one laser in the array of lasers is tuned to at least one of the channel wavelengths at the global temperature; a plurality of heaters located proximate at least other respective lasers in the array of lasers, respectively, the heaters being configured to raise respective local temperatures of the other respective lasers above the global temperature such that the other respective lasers are tuned to the other channel wavelengths, respectively; and a temperature wavelength control system for controlling the temperature control device to maintain the global temperature and for controlling the heaters to adjust the local temperatures in response to monitored wavelengths; wherein the one of the channel wavelengths tuned at the global temperature is the smallest of the channel wavelengths.

8. The temperature controlled multi-channel TOSA of claim 7, wherein the lasers are distributed feedback (DFB) lasers.

9. The temperature controlled multi-channel TOSA of claim 7, wherein the heaters are resistors located adjacent the lasers.

10. The temperature controlled multi-channel TOSA of claim 7, wherein the temperature control device is a thermo-electric cooler.

11. The temperature controlled multi-channel TOSA of claim 7, further comprising:
a thermal isolation bar located in the TOSA housing and thermally coupled to the temperature control device, wherein the thermal isolation bar is wire bonded to the lasers and electrically connected to circuitry outside of the TOSA housing such that the thermal isolation bar electrically connects the lasers to the circuitry while preventing external heat from being conducted to the lasers from outside the TOSA.

12. The temperature controlled multi-channel TOSA of claim 7, further comprising:
a plurality of laser thermal shields for thermally shielding the array of lasers, the laser thermal shields being thermally coupled to the temperature control device and defining a plurality of thermally shielded compartments, wherein each of the thermally shielded compartments receives and thermally shields a respective one of the lasers while allowing emitted laser light to pass out of the shielded compartments, and wherein the heaters are located in respective ones of the thermally shielded compartments.

13. The temperature controlled multi-channel TOSA of claim 7, wherein the optical multiplexer is an arrayed waveguide grating (AWG).

14. The temperature controlled multi-channel TOSA of claim 13 further comprising an AWG tray supporting the AWG above the array of lasers, the AWG tray being thermally coupled to the temperature control device.

15. The temperature controlled multi-channel TOSA of claim 7 wherein the channel wavelengths include ITU channels wavelengths.

16. The temperature controlled multi-channel TOSA of claim 7 wherein the monitored wavelengths are monitored outside of the TOSA to generate monitored wavelength data, and wherein the wavelength control system is configured to receive the monitored wavelength data representative of the monitored wavelengths.

17. A multi-channel transceiver module comprising: a transceiver housing; at least one temperature controlled multi-channel transmitter optical subassembly (TOSA) located in the transceiver housing, the TOSA being configured to transmit a wavelength division multiplexed (WDM) optical signal on multiple channel wavelengths, the TOSA comprising: an array of lasers configured to generate laser light, wherein each of the lasers is associated with a respective optical channel and is thermally tunable to a channel wavelength associated with the respective optical channel; an optical multiplexer optically coupled to the array of lasers, the optical multiplexer being configured to combine the laser light at different respective channel wavelengths; a temperature control device thermally coupled to the array of lasers for establishing a global temperature for the array of lasers such that at least one laser in the array of lasers is tuned to at least one of the channel wavelengths at the global temperature; a plurality of heaters located proximate at least other respective lasers in the array of lasers, respectively, the heaters being configured to raise respective local temperatures of the other respective lasers above the global temperature such that the other respective lasers are tuned to the other channel wavelengths, respectively; and a temperature wavelength control system for controlling the temperature control device to maintain the global temperature and for controlling the heaters to adjust the local temperatures in response to monitored wavelengths; and at least one multi-channel receiver optical subassembly (ROSA) located in the transceiver housing, the ROSA being configured to receive a wavelength division multiplexed (WDM) optical signal on multiple channel wavelengths; wherein the channel wavelengths include ITU channels wavelengths, and wherein the one of the ITU channel wavelengths tuned at the global temperature is the smallest of the ITU channel wavelengths.

18. The temperature controlled multi-channel transceiver module of claim 17 wherein the lasers are DFB lasers, the heaters are resistors located adjacent the lasers, respectively, and the temperature control device is a thermoelectric cooler thermally coupled to the array of lasers.

19. An optical line terminal comprising: at least first and second multi-channel transceivers, each of the multi-channel transceivers comprising: a transceiver housing; a temperature controlled multi-channel transmitter optical subassembly (TOSA) located in the transceiver housing, the TOSA being configured to transmit a wavelength division multiplexed (WDM) optical signal on multiple channel wavelengths, the TOSA comprising: an array of lasers configured to generate laser light, wherein each of the lasers is associated with a respective optical channel and is thermally tunable to a channel wavelength associated with the respective optical channel; an optical multiplexer optically coupled to the array of lasers, the optical multiplexer being configured to combine the laser light at different respective channel wavelengths; a temperature control device thermally coupled to the array of lasers for establishing a global temperature for the array of lasers such that at least one laser in the array of lasers is tuned to at least one of the channel wavelengths at the global temperature; a plurality of heaters located proximate at least other respective lasers in the array of lasers, respectively, the heaters being configured to raise respective local temperatures of the other respective lasers above the global temperature such that the other respective lasers are tuned to the other channel wavelengths, respectively; and a temperature wavelength control system for controlling the temperature control device to maintain the global temperature and for controlling the heaters to adjust the local temperatures in response to monitored wavelengths; and a multi-channel receiver optical subassembly (ROSA) located in the transceiver housing, the ROSA being configured to receive a wavelength division multiplexed (WDM) optical signal on multiple channel wavelengths; wherein the channel wavelengths include ITU channels wavelengths, and wherein the one of the ITU channel wavelengths tuned at the global temperature is the smallest of the ITU channel wavelengths.

20. The optical line terminal of claim 19, wherein the lasers are DFB lasers, the heaters are resistors located adjacent the lasers, respectively, and the temperature control device is a thermoelectric cooler thermally coupled to the array of lasers.

* * * * *